US008384482B2

(12) United States Patent
Wilson et al.

(10) Patent No.: US 8,384,482 B2
(45) Date of Patent: Feb. 26, 2013

(54) WIDEBAND DOHERTY AMPLIFIER CIRCUIT WITH IMPEDANCE COMBINER

(75) Inventors: Richard Wilson, Morgan Hill, CA (US); Saurabh Goel, Campbell, CA (US)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/616,845

(22) Filed: Sep. 14, 2012

(65) Prior Publication Data
US 2013/0009708 A1 Jan. 10, 2013

Related U.S. Application Data

(62) Division of application No. 13/163,388, filed on Jun. 17, 2011.

(51) Int. Cl.
*H03F 3/68* (2006.01)
(52) U.S. Cl. ................... 330/295; 330/124 R
(58) Field of Classification Search ............. 330/295, 330/124 R, 84, 126, 297
See application file for complete search history.

(56) References Cited

U.S. PATENT DOCUMENTS 8,274,332 B2 * 9/2012 Cho et al. .............. 330/295
2002/0097087 A1 * 7/2002 Petz et al. .............. 330/124 R
2011/0140775 A1 * 6/2011 Hong et al. ............ 330/124 R

* cited by examiner

*Primary Examiner* — Henry Choe
(74) *Attorney, Agent, or Firm* — Murphy, Bilak & Homiller, PLLC

(57) ABSTRACT

An amplifier circuit includes a first amplifier operable to turn on at a first power level, a second amplifier operable to turn on at a second power level below the first power level and a third amplifier operable to turn on at all power levels. A first power combiner is operable to combine an output of the third amplifier with an output of the second amplifier at a first power combining node to form a first combined amplifier output. A second power combiner is operable to combine the first combined amplifier output with an output of the first amplifier at a second power combining node to form a second combined amplifier output. An impedance transformer is operable to transform a load impedance of the amplifier circuit to a transformed impedance at the second power combining node, the transformed impedance matching an impedance of the first and second power combiners.

13 Claims, 5 Drawing Sheets

WIDEBAND DOHERTY AMPLIFIER CIRCUIT WITH IMPEDANCE COMBINER

PRIORITY CLAIM

This application is a Divisional of U.S. application Ser. No. 13/163,388, filed on Jun. 17, 2011, the content of said application incorporated herein by reference in its entirety.

FIELD OF TECHNOLOGY

The present application relates to Doherty amplifiers, in particular Doherty amplifiers designed for a wideband frequency range of operation.

BACKGROUND

RF (radio frequency) power architectures within the telecommunications field focus on achieving high DC-to-RF efficiency at significant power back off from Psat (the average output power when the amplifier is driven deep into saturation). This is due to the high peak to average ratio (PAR) of the transmitted digital signals such as W-CDMA (wideband code division multiple access), LTE (long term evolution) and WiMAX (worldwide interoperability for microwave access). The most popular power amplifier architecture currently employed is the Doherty amplifier. The Doherty amplifier employs a class AB main amplifier and a class C peaking amplifier, and efficiency is enhanced through load modulation of the main amplifier from the peaking amplifier. However, if high efficiency at a high output backoff (OBO) is required, a highly asymmetric ratio between the main and peaking amplifiers is required.

The Doherty architecture has an inherent degradation in the efficiency between the peak OBO point and the peak power point. To overcome this, a three way Doherty architecture can be used, in which the main class AB amplifier is replaced with a Doherty amplifier and load modulation is provided to the first peaking amplifier between the peak OBO point and the peak power point. However, the main amplifier is connected to the external load impedance (typically 50 Ohms) through a series of three ¼λ (quarter wavelength) transmission lines prior to any device impedance matching. This can lead to the amplifier being narrow band in nature due to the band-limiting characteristics of the ¼λ transmission lines. As such, three way Doherty amplifiers are typically designed for a specific band of operation used for wireless communication applications like WCDMA, LTE, WiMAX, etc. Such bands of operation are 1805-1880 MHz, 1930-1990 MHz, etc.

SUMMARY

Embodiments described herein employ a constant impedance combiner having a characteristic impedance equal to the required load modulated high impedance state of the main amplifier in a three way wideband Doherty amplifier circuit when the first and second peaking amplifiers are turned off. In this most narrow band case there is minimal band limiting presented to the main amplifier. A significant amount of band limiting is removed from the main amplifier path when running in the back off power region, yielding more constant power versus frequency and more constant efficiency versus frequency at a fixed back off power level. The amplifier embodiments described herein are well suited for wider band applications such that one amplifier circuit can simultaneously cover two or more adjacent bands of operation or be more consistent across a complete band of operation than currently existing architectures.

According to one embodiment of an amplifier circuit, the amplifier circuit includes a main amplifier biased at Class B or AB mode, a first peaking amplifier biased at Class C mode, a second peaking amplifier biased at Class C mode and a constant impedance combiner. The constant impedance combiner has a first node connected to an output of the main amplifier, a second node connected to an output of the first peaking amplifier, a third node connected to an output of the second peaking amplifier and a fourth node connected to a load. The constant impedance combiner is operable to transform a load impedance at the fourth node to a transformed impedance at the third node, and maintain the same transformed impedance at the first, second and third nodes.

According to one embodiment of a method of operating an amplifier circuit, the method includes: biasing a main amplifier at Class B or AB mode; biasing a first peaking amplifier at Class C mode; biasing a second peaking amplifier at Class C mode; connecting a first node of a constant impedance combiner to an output of the main amplifier, a second node of the constant impedance combiner to an output of the first peaking amplifier, a third node of the constant impedance combiner to an output of the second peaking amplifier, and a fourth node to a load; and transforming a load impedance at the fourth node to a transformed impedance at the third node so that the same transformed impedance is maintained at the first, second and third nodes.

According to another embodiment of an amplifier circuit, the amplifier circuit includes a first amplifier operable to turn on at a first power level, a second amplifier operable to turn on at a second power level below the first power level and a third amplifier operable to remain on at all power levels. A first power combiner is operable to combine an output of the third amplifier with an output of the second amplifier at a first power combining node to form a first combined amplifier output. A second power combiner is operable to combine the first combined amplifier output with an output of the first amplifier at a second power combining node to form a second combined amplifier output. An impedance transformer is operable to transform a load impedance of the amplifier circuit to a transformed impedance at the second power combining node, the transformed impedance matching an impedance of the first and second power combiners.

According to another embodiment of a method of operating an amplifier circuit, the method includes: turning on a first amplifier at a first power level; turning on a second amplifier at a second power level below the first power level; turning on a third amplifier at all power levels; combining an output of the third amplifier with an output of the second amplifier at a first power combining node to form a first combined amplifier output; combining the first combined amplifier output with an output of the first amplifier at a second power combining node to form a second combined amplifier output; and transforming a load impedance of the amplifier circuit to a transformed impedance at the second power combining node with no impedance transformation occurring from the second power combining node to the first power combining node.

According to an embodiment of a three way wideband Doherty amplifier circuit, the circuit includes a first peaking amplifier operable to turn on at a first power level, a second peaking amplifier operable to turn on at a second power level below the first power level and a main power amplifier operable to turn on at all power levels. The main power amplifier has a high impedance load modulated state when the first and second peaking amplifiers are turned off. The Doherty amplifier circuit further includes a constant impedance combiner connected to an output of each amplifier. The constant impedance combiner has a characteristic impedance which matches the impedance of the main amplifier in the high impedance load modulated state with or without an output matching device connecting the main amplifier output to the constant impedance combiner, as viewed from the output of the main amplifier.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
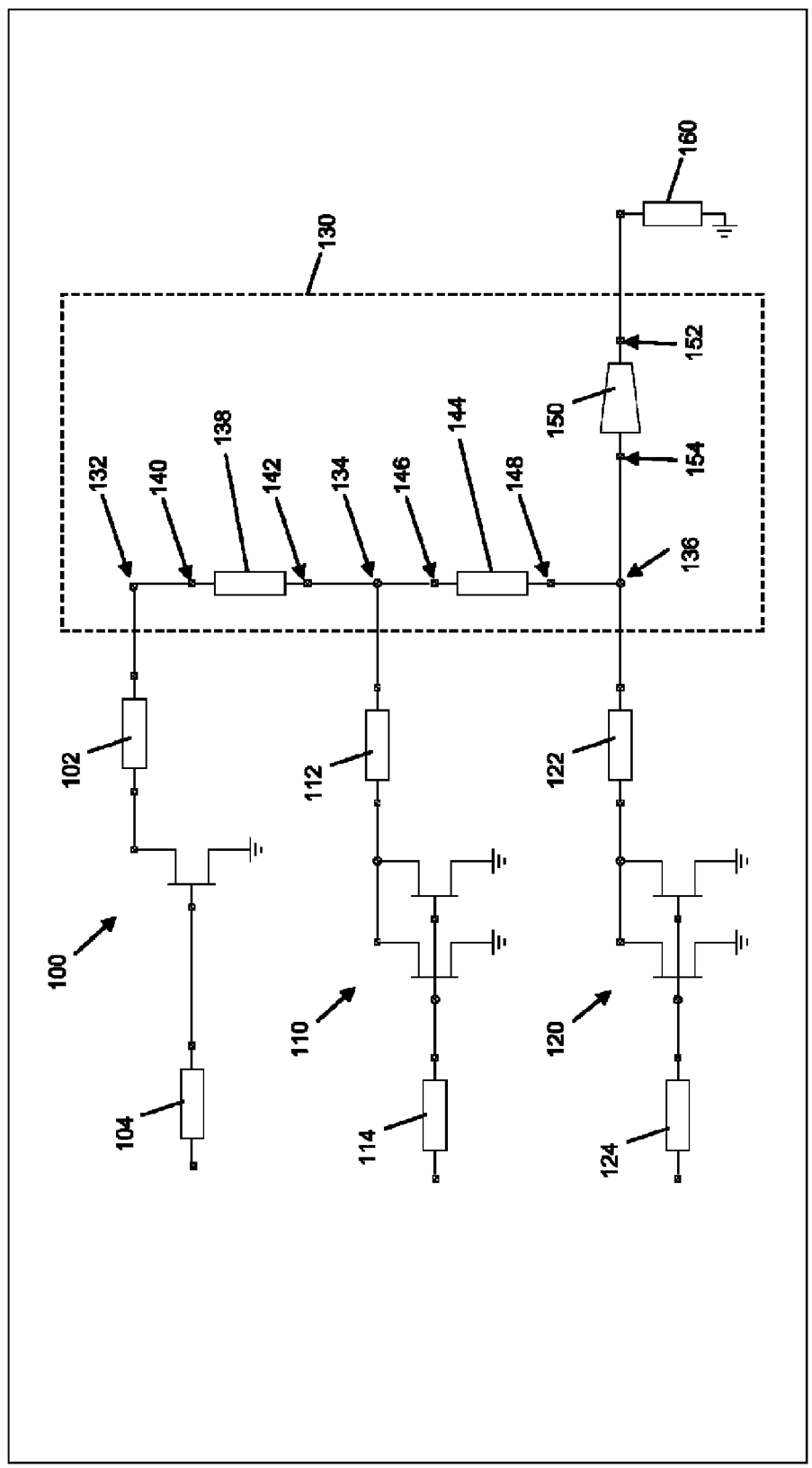
FIG. 1 illustrates a schematic circuit diagram of a three way wideband Doherty amplifier circuit having a constant impedance combiner according to an embodiment.

FIG. 1 illustrates an embodiment of a three way wideband Doherty amplifier circuit which includes a main amplifier 100 biased at Class B or AB mode, a first peaking amplifier 110 biased at Class C mode, a second peaking amplifier 120 biased at Class C mode, and a constant impedance combiner 130. Each amplifier 100, 110, 120 includes one or more active devices and may also include a respective output matching device 102, 112, 122. At low power levels, only the main amplifier 100 is operational. The efficiency of the main amplifier 100 increases as the power level increases. The main amplifier 100 eventually reaches a maximum efficiency point as the power level continues to rise. At this power level, the first peaking amplifier 110 turns on. The efficiency of the first peaking amplifier 110 similarly increases for power levels above this point. A second maximum efficiency point is attained when the first peaking amplifier 110 reaches its maximum efficiency point, at which point the second peaking amplifier 120 turns on. The second peaking amplifier 120 reaches a third maximum efficiency at a yet higher power level (full power). As such, the three way wideband Doherty amplifier circuit has three maximum efficiency points.

Load modulation is implemented by the fundamental current ratio between the main amplifier 100 and the peaking amplifiers 110, 120. In addition, the constant impedance combiner 130 combines or sums the load currents of the amplifiers 100, 110, 120 so that the output voltage of the wideband Doherty amplifier circuit is determined by the summation of the load currents multiplied by the load impedance. In more detail, the constant impedance combiner 130 has a first node 132 connected to the output of the main amplifier 100. In one embodiment, the first node 132 of the constant impedance combiner 130 is connected to the main amplifier output via an output matching device 102. Input matching devices 104, 114, 124 may similarly be provided at the respective inputs of the amplifiers 100, 110, 120. In another embodiment, the first node 132 of the constant impedance combiner 130 is directly connected to the main amplifier output and no impedance match device is provided for the main amplifier 100 as described in more detail later herein. In each case, the constant impedance combiner 130 also has a second node 134 connected to the output of the first peaking amplifier 110 and a third node 136 connected to the output of the second peaking amplifier 120 either of which may or may not also include a respective output matching device 112, 122.

The impedance of the main amplifier 100 in a high impedance load modulated state when the peaking amplifiers 110, 120 are turned off is a function of the load current delivered by the peaking amplifiers 110, 120. The main amplifier 100 operates in the high impedance state when the peaking amplifiers 110, 120 are turned off and in a low impedance state when the peaking amplifiers 110, 120 are turned on. For example, if the input power is relatively small so that neither peaking amplifier 110, 120 is turned on, the impedance presented to the main amplifier 100 will increase (2× is indicative, but the impedance could increase from 1× to 4× or more based on the implementation) compared to its low impedance state. At low power level the output impedance of the peaking amplifiers 110, 120 is theoretically infinite or very large when looking into the amplifier device on the output side after the corresponding output match network 112, 122 from the second node 134 and the third node 134 of the constant impedance combiner 130 respectively, because the peaking amplifiers 110, 120 are turned off and contribute zero load current.

The constant impedance combiner 130 has a characteristic impedance which matches the impedance of the main amplifier 100 in the high impedance load modulated state with or without the output matching network 102 connecting the main amplifier output to the constant impedance combiner 130, as viewed from the output of the main amplifier 100. In doing so, the output back off of the amplifier circuit has minimal bandwidth limitations which enables the amplifier circuit to be used in wideband applications.

In the embodiment illustrated in FIG. 1, the constant impedance combiner 130 also has a first power combiner 138 with a first terminal 140 connected to the first node 132 of the constant impedance combiner 130 and a second terminal 142 connected to the second node 134 of the constant impedance combiner 130. A second power combiner 144 has a first terminal 146 connected to the second node 134 of the constant impedance combiner 130 and a second terminal 148 connected to the third node 136 of the constant impedance combiner 130. The first and second power combiners 138, 144 have the same (i.e. identical or nearly identical) impedance.

The constant impedance combiner 130 further has an impedance transformer 150 having a first terminal 152 connected to the load 160 of the amplifier circuit and a second terminal 154 connected to the third node 136 of the constant impedance combiner 130. The impedance transformer 150 is a wideband impedance transformer according to this embodiment in that the transformer 150 has a wider end and a narrower end. The narrower end may be connected to the load 160 and the wider end connected to the third node 136 of the constant impedance combiner 130 as shown in FIG. 1. Alternatively, the wider end of the transformer 150 may be connected to the load 160 and the narrower end connected to the third node 136 of the constant impedance combiner 130 in other embodiments.

During operation, the wideband impedance transformer 150 transforms the load impedance at its first terminal 152 to a transformed impedance at its second terminal 154 which matches (i.e. identically or nearly identically) the impedance of the first and second power combiners 138, 144. As such, no additional appreciable impedance transformation occurs between the third and second nodes 136, 134 (via the second power combiner 144) and between the second and first nodes 134, 132 (via the first power combiner 138) of the constant impedance combiner 130 because the reactance of the power combiners 138, 144 is minimal when the transformed impedance matches the power combiner impedances. As such, a constant impedance is maintained at the first, second and third nodes 132, 134, 136.

For example, the load impedance may be 50 Ohms and the wideband impedance transformer 150 may be shaped to transform the 50 Ohm load impedance to 20 Ohms at the third node 136 of the constant impedance combiner 130. Each of the power combiners 138, 144 may be 20 Ohm ¼λ (quarter wavelength) transmission lines. As such, the power combiners 138, 144 provide no further impedance transformation and the same 20 Ohm transformed impedance is maintained at the third, second and first nodes 136, 134, 132 of the constant impedance combiner 130. Hence the term 'constant impedance combiner'. A single impedance transformation occurs between the load 160 and the third node 136 of the constant impedance combiner 130, and no further impedance transformation occurs between nodes 136, 134 and 132, and the amplifier circuit 100 has an optimized impedance for correct load modulation at back off 2 (i.e. the main amplifier is on, and the first and second peaking amplifiers are off), back off 1 (i.e. the main and peaking 1 amplifier are on, and the second peaking amplifier is off) and full power (i.e. all amplifiers are on).

As shown in FIG. 1, the output of each amplifier 100, 110, 120 may be connected to the respective node 132, 134, 136 of the constant impedance combiner 130 via a corresponding output matching device 102, 112, 122. Each output matching device 102, 112, 122 provides further impedance transformation between the specific transformed impedance presented at the three nodes 132, 134, 136 of the constant impedance combiner 130 and the corresponding amplifier output. Returning to the 50 Ohm load impedance example given above, the main amplifier 100 has an 11.1 Ohm load impedance at its output and the first peaking amplifier 110 may have an 18 Ohm output impedance after its output matching device 112 and the second peaking amplifier 120 may have a 50 Ohm output impedance after its output matching device 122. The respective output matching devices 102, 112, 122 provide the desired impedance transformation between the transformed impedance presented at the three nodes 132, 134, 136 of the constant impedance combiner 130 and the corresponding amplifier output impedance.

Figure 2:
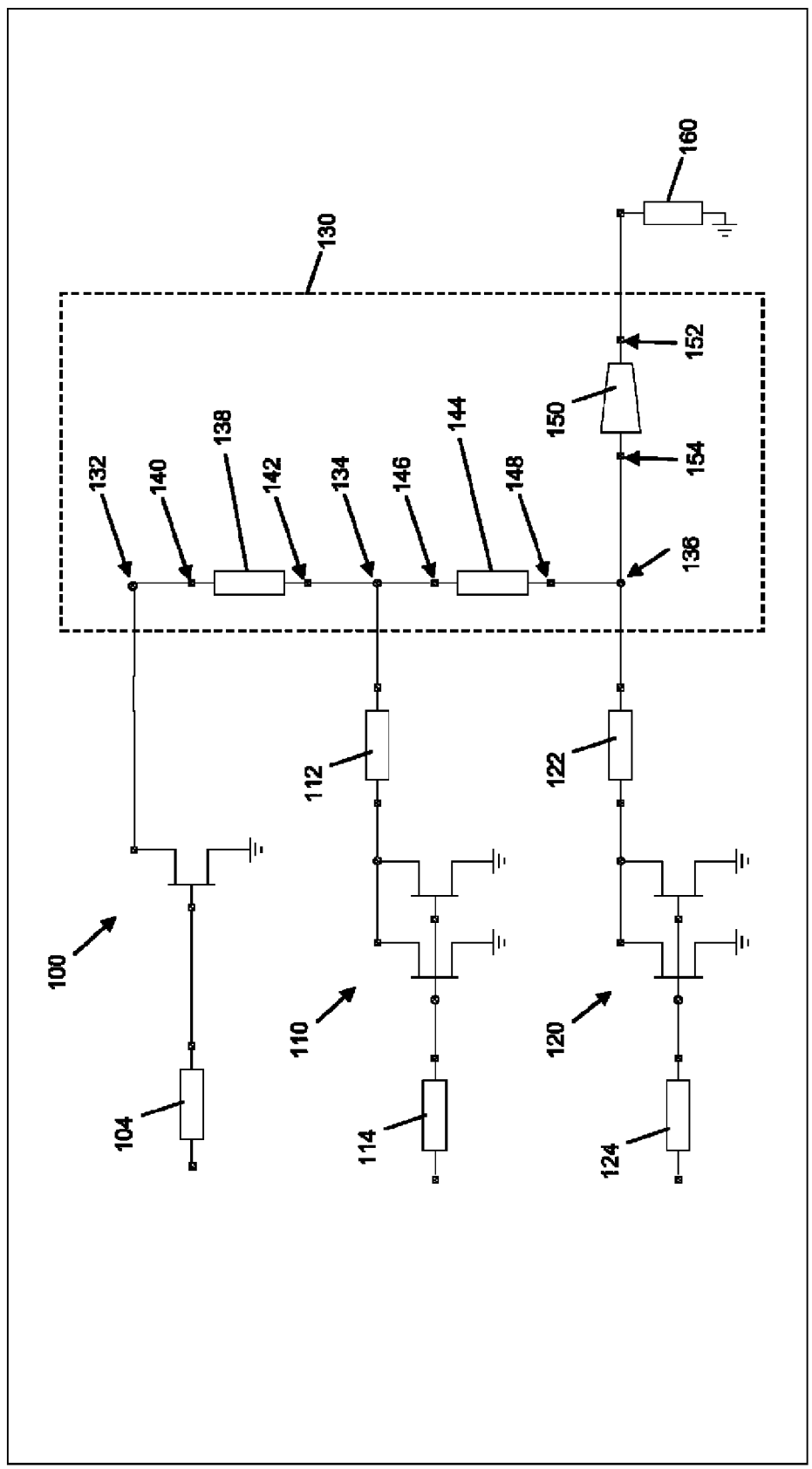
FIG. 2 illustrates a schematic circuit diagram of a three way wideband Doherty amplifier circuit having a constant impedance combiner according to another embodiment.

FIG. 2 illustrates another embodiment of a three way wideband Doherty amplifier circuit. The circuit of FIG. 2 is similar to the circuit of FIG. 1, except there is no output matching device (102) connecting the output of the main amplifier 100 to the first node 132 of the constant impedance combiner 130. Instead, the output of the main amplifier 100 is directly connected to the first node 132. According to this embodiment, the main amplifier 100 has the same impedance as that of the first power combiner 138 when the main amplifier 100 operates in the high impedance state (i.e. when the peaking amplifiers are turned off). Again returning to the 50 Ohm load impedance example given above, the 11.1 Ohm output impedance of the main amplifier 100 transforms to 20 Ohms (1.8× transformation factor) in the high impedance state which matches the 20 Ohm impedance present at the first node 132 of the constant impedance combiner 130. Accordingly, no further impedance transformation is needed between the first node 132 of the constant impedance combiner 130 and the main amplifier output in the high impedance (load modulated) state.

Figure 3:
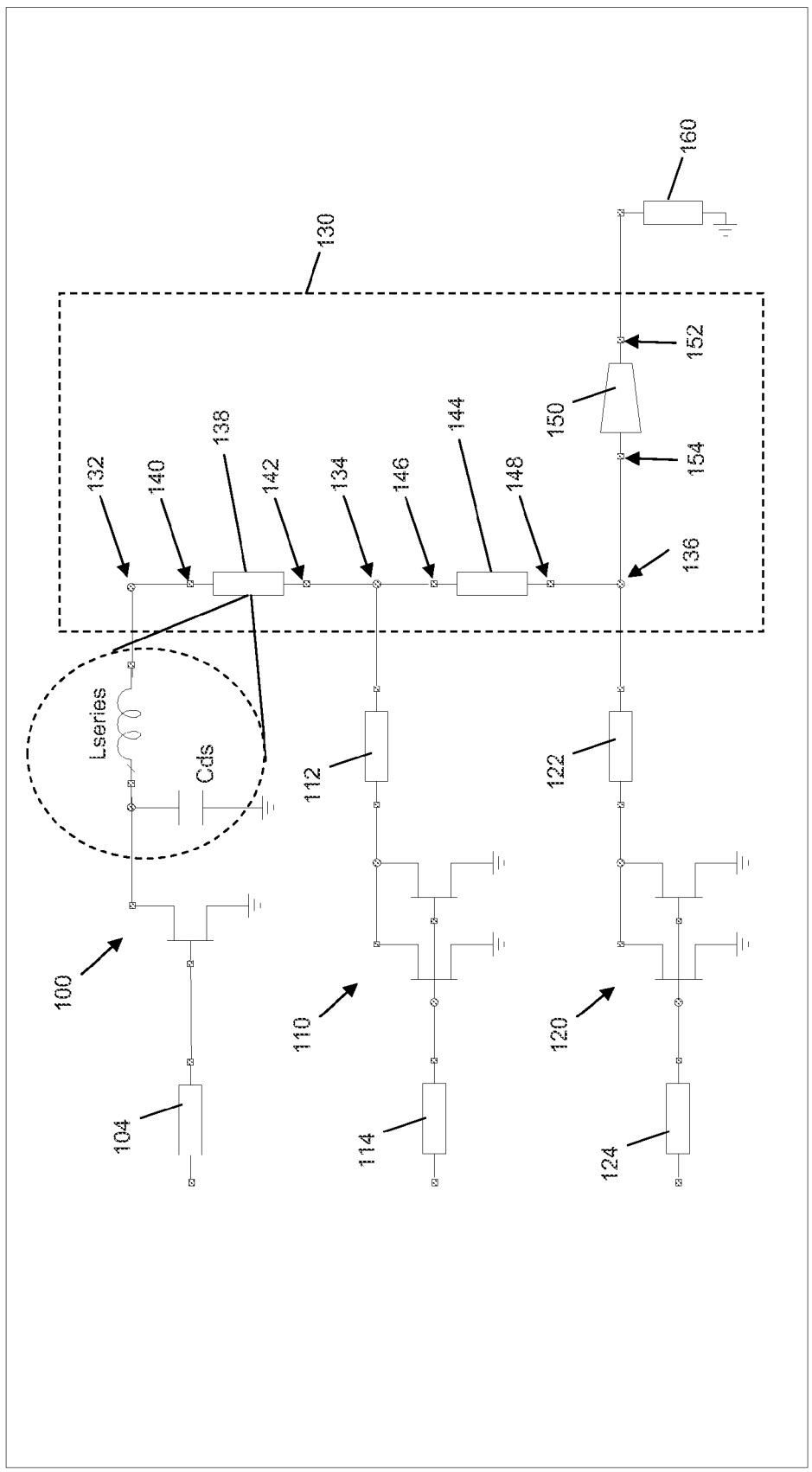
FIG. 3 illustrates a schematic circuit diagram of a three way wideband Doherty amplifier circuit having a constant impedance combiner according to yet another embodiment.

FIG. 3 illustrates yet another embodiment of a three way wideband Doherty amplifier circuit. The circuit of FIG. 3 is similar to the circuit of FIG. 2, except the parasitic output capacitance which for a MOS device is drain-to-source capacitance (schematically illustrated as capacitor Cds in FIG. 3) of the main amplifier 100 and the parasitic inductance (schematically illustrated as inductor Lseries in FIG. 3) associated with connecting the main amplifier output to the first node 132 of the constant impedance combiner 130 are absorbed into the impedance of the first power combiner 138 of the constant impedance combiner 130. According to this embodiment, the main amplifier impedance matches that of the first power combiner 138 as viewed from the first node 132 of the constant impedance combiner 130 when the main amplifier 100 operates in the high impedance load modulated state (i.e. when the peaking amplifiers are turned off).

Figure 4:
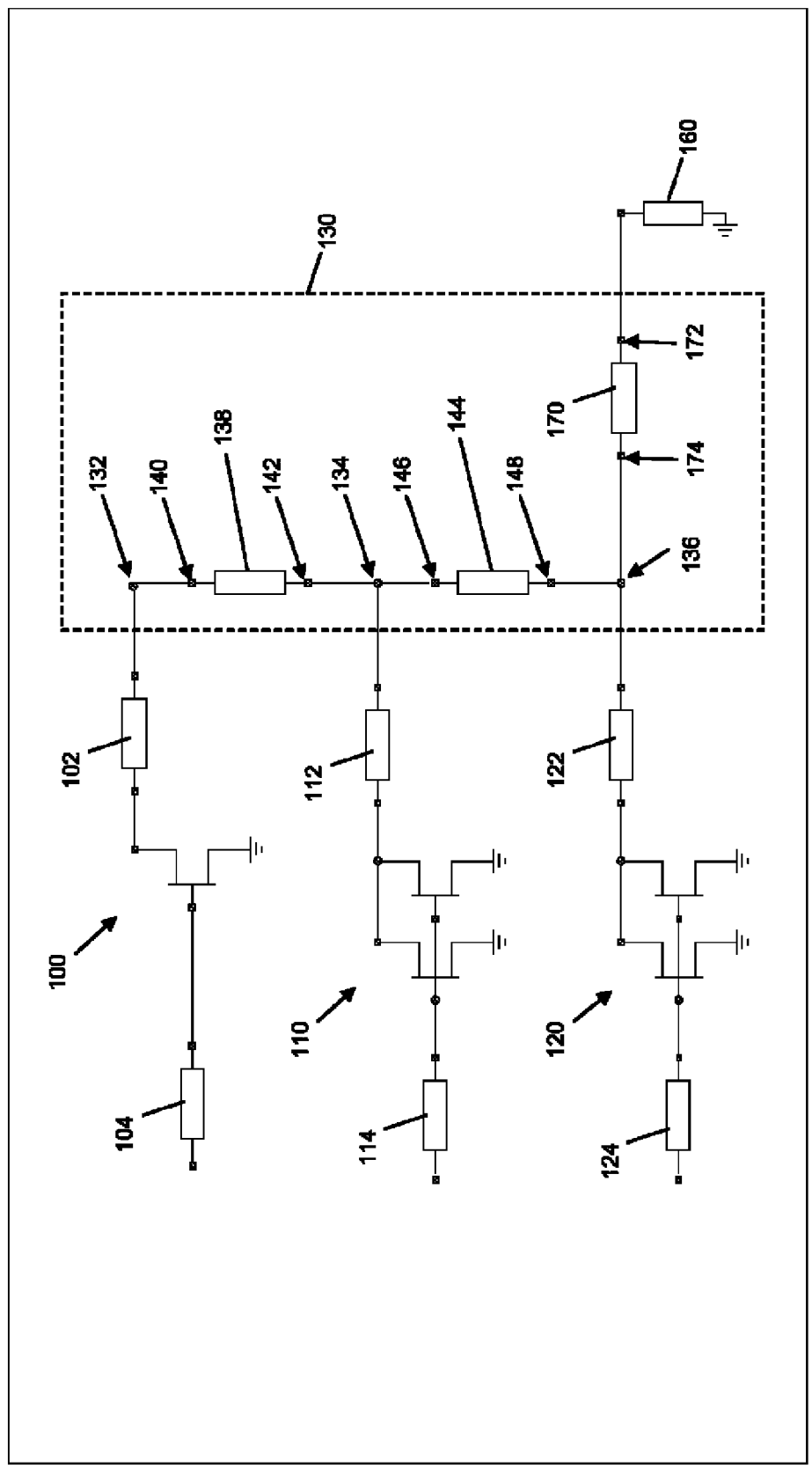
FIG. 4 illustrates a schematic circuit diagram of a three way wideband Doherty amplifier circuit having a constant impedance combiner according to still another embodiment.

FIG. 4 illustrates still another embodiment of a three way wideband Doherty amplifier circuit. The circuit of FIG. 4 is similar to the circuit of FIG. 1, except the impedance transformer 170 of the constant impedance combiner 130 is a ¼λ transmission line instead of a wideband (tapered) impedance transformer (150). According to this embodiment, the ¼λ transmission line 170 connects the load 160 to the third node 136 of the constant impedance combiner 130 and transforms the load impedance at its first terminal 172 to a transformed impedance at its second terminal 174 so that the transformed impedance at the third node 136 matches the impedance of the first and second power combiners 138, 144. Once again returning to the 50 Ohm load impedance example given above, both power combiners 138, 144 may have a 20 Ohm impedance and the ¼λ transmission line 170 which connects the 50 Ohm load 160 to the third node 136 of the constant impedance combiner 130 may have an impedance of 31 Ohms. Accordingly, only a single impedance transformation is performed by the constant impedance combiner 130. In yet another embodiment, the impedance transformer 170 can be two transmission lines connected in series or a lumped L (inductive) or a lumped C (capacitive) structure. Yet other types of impedance transformers may be used.

Figure 5:
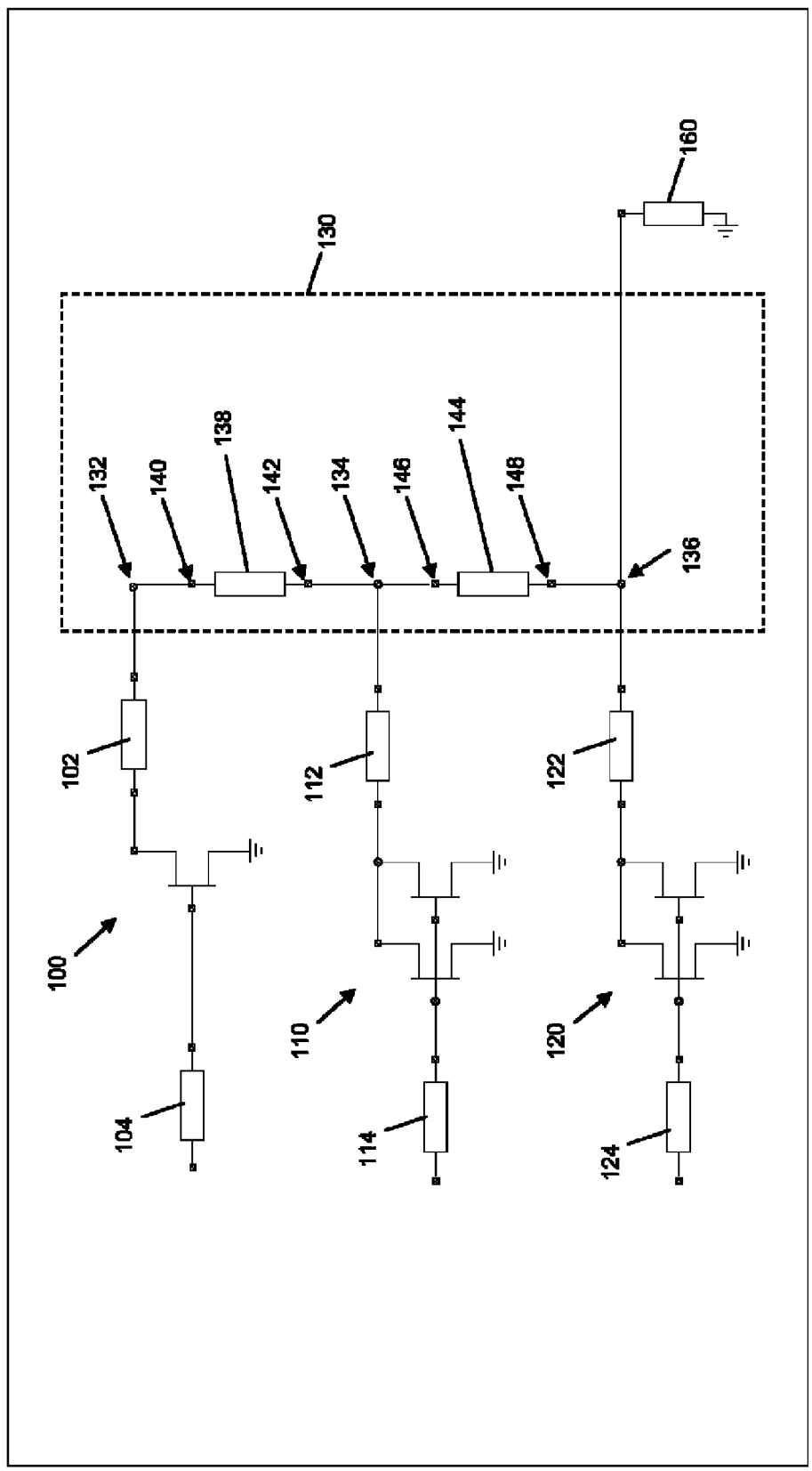
FIG. 5 illustrates a schematic circuit diagram of a three way wideband Doherty amplifier circuit having a constant impedance combiner which provides no impedance transformation according to an embodiment.

FIG. 5 illustrates an embodiment of a three way wideband Doherty amplifier circuit where the constant impedance combiner 130 has no impedance transformer. Instead, each power combiner 138, 144 has an impedance with matches the load impedance. According to this embodiment, the constant impedance combiner 130 provides no impedance transformation and the impedance at nodes 132, 134 and 136 of the combiner 130 corresponds to the load impedance in each case.

Specific exemplary impedance values for the different amplifier circuit components have been described herein for illustrative purposes only. These specific examples are not intended to limit the scope of the claims in any way unless explicitly claimed. For example, load impedances other than 50 Ohms may also be considered such as 75 Ohms, etc. The components of the constant impedance combiner can be sized accordingly to ensure only a single impedance transformation is performed by the constant impedance combiner. This also applies for the specific amplifier impedance values expressed herein.

Terms such as "same", "match" and "matches" as used herein are intended to mean identical, nearly identical or approximately so that some reasonable amount of variation is contemplated without departing from the spirit of the invention. The term "constant" means not changing or varying, or changing or varying slightly again so that some reasonable amount of variation is contemplated without departing from the spirit of the invention. Further, terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An amplifier circuit, comprising:
a first amplifier operable to turn on at a first power level;
a second amplifier operable to turn on at a second power level below the first power level;
a third amplifier operable to turn on at all power levels;
a first power combiner operable to combine an output of the third amplifier with an output of the second amplifier at a first power combining node to form a first combined amplifier output;
a second power combiner operable to combine the first combined amplifier output with an output of the first amplifier at a second power combining node to form a second combined amplifier output; and
an impedance transformer operable to transform a load impedance of the amplifier circuit to a transformed impedance at the second power combining node, the transformed impedance matching an impedance of the first and second power combiners.

2. The amplifier circuit of claim 1, wherein a parasitic output capacitance of the main amplifier and a parasitic inductance associated with connecting the main amplifier to the first node are absorbed into the impedance of the first power combiner.

3. The amplifier circuit of claim 1, wherein the impedance transformer is tapered and has one end connected to the second power combining node and another end presented with the load impedance.

4. The amplifier circuit of claim 1, wherein the first power combiner is a 20 Ohm ¼λ transmission line, the second power combiner is a 20 Ohm ¼λ transmission line, and the impedance transformer is operable to transform a 50 Ohm load impedance at one end to a 20 Ohm impedance at the second power combining node.

5. The amplifier circuit of claim 1, wherein the third amplifier is in a high impedance state when operating at or below the second power level and in a low impedance state when operating at or above the first power level, and wherein the impedance of the first power combiner matches the impedance of the third amplifier in the high impedance state with or without an output matching device connecting the output of the third amplifier to the constant impedance combiner, as viewed from the output of the third amplifier.

6. The amplifier circuit of claim 1, further comprising:
a first output matching device connecting the output of the first amplifier to the second power combining node;
a second output matching device connecting the output of the second amplifier to the first power combining node; and
wherein the output of the third amplifier is directly connected to the first power combiner.

7. A method of operating an amplifier circuit, comprising:
turning on a first amplifier at a first power level;
turning on a second amplifier at a second power level below the first power level;
turning on a third amplifier at all power levels;
combining an output of the third amplifier with an output of the second amplifier at a first power combining node to form a first combined amplifier output;
combining the first combined amplifier output with an output of the first amplifier at a second power combining node to form a second combined amplifier output; and
transforming a load impedance of the amplifier circuit to a transformed impedance at the second power combining node with no impedance transformation occurring from the second power combining node to the first power combining node.

8. The method of claim 7, further comprising connecting the output of the third amplifier to the first power combining node via a power combiner having an impedance such that no impedance transformation occurs from the first power combining node to the power combiner and from the power combiner to the output of the third amplifier.

9. The method of claim 7, comprising:
connecting one end of a tapered impedance transformer to the second power combining node and another end of the tapered impedance transformer to the load impedance; and
transforming the load impedance to the transformed impedance at the second power combining node via the tapered impedance transformer.

10. The method of claim 7, further comprising:
connecting the output of the main amplifier to the first power combining node via a first 20 Ohm ¼λ transmission line;
connecting the output of the second amplifier to the second power combining node via a second 20 Ohm ¼λ transmission line; and
transforming a 50 Ohm load impedance of the amplifier circuit to a 20 Ohm impedance at the second power combining node.

11. The method of claim 7, further comprising:
operating the third amplifier in a high impedance state at or below the second power level and in a low impedance state at or above the first power level; and
transforming the load impedance to match the impedance of the third amplifier in the high impedance state.

12. The method of claim 7, further comprising:
connecting an output of the first amplifier to the second power combining node via a first impedance match device;

connecting an output of the second amplifier to the first power combining node via a second impedance match device; and directly connecting the output of the third amplifier to a first terminal of a power combiner having a second terminal connected to the first power combining node.

13. A three way wideband Doherty amplifier circuit, comprising:

a first peaking amplifier operable to turn on at a first power level;

a second peaking amplifier operable to turn on at a second power level below the first power level;

a main power amplifier operable to turn on at all power levels and having a high impedance load modulated state when the first and second peaking amplifiers are turned off; and a constant impedance combiner connected to an output of each amplifier and having a characteristic impedance which matches the impedance of the main amplifier in the high impedance load modulated state with or without an output matching device connecting the main amplifier output to the constant impedance combiner, as viewed from the output of the main amplifier.

* * * * *